United States Patent [19]

Svendsen

[11] 4,393,301

[45] Jul. 12, 1983

[54] SERIAL-TO-PARALLEL CONVERTER

[75] Inventor: Gordon D. Svendsen, Belmont, Calif.

[73] Assignee: Ampex Corporation, Redwood City, Calif.

[21] Appl. No.: 240,632

[22] Filed: Mar. 5, 1981

[51] Int. Cl.³ .............................................. G06F 5/04
[52] U.S. Cl. ..................................... 377/56; 377/47; 377/118; 364/900
[58] Field of Search ........ 235/92 CV, 92 FQ, 92 TF; 364/200 MS File, 900 MS File

[56] References Cited

U.S. PATENT DOCUMENTS

| | | | |
|---|---|---|---|
| 3,278,727 | 10/1966 | Geis | 235/92 TF |
| 3,898,620 | 8/1975 | Leterrier | 364/900 |
| 3,909,791 | 9/1975 | van den Berg | 364/900 |
| 4,048,474 | 9/1977 | Olesen | 235/92 FQ X |
| 4,066,875 | 1/1978 | Ollington | 235/92 TF |
| 4,104,950 | 8/1978 | Finley | 84/462 |
| 4,137,562 | 1/1979 | Boeck | 364/200 |
| 4,202,042 | 5/1980 | Connors | 364/900 |

FOREIGN PATENT DOCUMENTS

1162408 11/1961 Fed. Rep. of Germany ........ 235/92 CV

Primary Examiner—James D. Thomas
Assistant Examiner—James T. Beran
Attorney, Agent, or Firm—Joel D. Talcott; Elizabeth E. Strnad

[57] ABSTRACT

A serial-to-parallel converter receives serial data bits forming serial input words and serial word synchronizing pulses indicating the length of the serial input words. A parallel clock signal is generated synchronously with an integer number of serial word synchronizing pulses. The input data is sequentially supplied via a direct data path to an output storage means. A synchronous counter counts the received consecutive serial data bits and in response to each count a decoder sequentially enables one respective output storage means to store therein one data bit. The stored data is released simultaneously from the output storage means in form of a parallel word in response to the parallel clock signal. Means for changing the length of the parallel output word are provided.

11 Claims, 6 Drawing Figures

FIG_1

FIG_3

SERIAL-TO-PARALLEL CONVERTER

BACKGROUND OF THE INVENTION

The invention is related to serial-to-parallel converters and more particularly to a converter in which the input data bits are sequentially supplied via a direct data path to output storage means and released in parallel therefrom. The length of a serial input word or parallel output word may be changed while the bit positions of the parallel output word remain unchanged with respect to the sequence in which the serial data bits are received.

Digital data processing systems frequently include circuits operating at different clock frequencies, thus requiring converters from high to low or low to high speed of data transfer between these circuits. One such known device is a serial-to-parallel converter which receives serial input data sequentially at a relatively high clock frequency, for example, from a peripheral device, such as a magnetic recording and playback device and it provides parallel output data at a significantly lower clock frequency, as it may be necessary for further processing, for example by a digital computer.

One type of prior art serial-to-parallel converter utilizes input shift registers into which the serial input data is fed sequentially and clocked therethrough in serial form. The serial data from the register is sequentially applied to parallel output latches and released in parallel in response to a parallel clock signal. Such prior art system is described and shown for example in a manual entitled HBR-3000 Magnetic Recorder, Provisional Data, No. 001050, Section 3, Serial-to-Parallel, and Schematic Drawing No. 1255592-01, issued Feb. 1, 1978 by Ampex Corporation, assignee of the present patent application.

It is a significant disadvantage of the above type of prior art converters that at each serial clock pulse the input data is shifted by one bit position through the device. Consequently, it is difficult to trace the individual data bits during operation and the bit positions are not known until the data appears on the output latches just prior to being clocked out in form of a parallel word. Consequently, data retrieval and trouble shooting are obstructed. Also, there is no serial word synchronizing pulse provided in these prior art devices. If the length of the serial input word or parallel output word is changed, the first and subsequent data bits appear at different output terminals for each such change. The foregoing also occurs after operation has been interrupted and restarted. These prior art converters are not suitable for applications where it is necessary to maintain known data bit positions during operation.

Other types of known prior art serial-to-parallel converters have a synchronizing data code supplied sequentially with the incoming data and through the same data path, via an input register. These converters require additional circuits for detecting the time when the synchronizing data is contained in the input register. Besides, in these prior art converters, the length of the serial or parallel word cannot be readily changed.

SUMMARY OF THE INVENTION

Accordingly, it is an object of the present invention to provide a serial-to-parallel converter in which the bit positions of the parallel output word are known with respect to the sequence in which the serial data bits are received.

It is another object to provide a serial-to-parallel converter in which the length of the parallel output word can be readily changed.

It is still a further object to provide a serial-to-parallel converter in which the first data bit of the parallel output word is obtained at the same output terminal even after the parallel word length is changed or after the operation has been interrupted, while the subsequent data bits appear at respective output terminals in sequential order.

It is a further object to provide a serial-to-parallel converter in which the length of the parallel output word is obtained by combining the length of one or more serial input words.

It is a further object to provide a serial-to-parallel converter having a parallel clock pulse derived from an integer number of serial word synchronizing pulses.

It is still a further object of the invention to provide a serial-to-parallel converter in which the serial input data is fed synchronously via a direct data path into an output storage means.

It is another object of the invention to provide a serial-to-parallel converter in which the serial word synchronizing pulses are received and processed via a signal path different from the data path.

It is still another object to provide a serial-to-parallel converter having the above indicated features and in which data retrieval and trouble shooting are facilitated.

DETAILED DESCRIPTION

In the following specification and claims terms such as signal, voltage, pulse, etc., will be used interchangeably with respect to the digital signals processed by the preferred embodiment.

Now the invention will be described with reference to the simplified block diagram of FIG. 1 and related timing diagram of FIG. 3.

A continuous stream of serial data bits B forming serial words of a known length is received on line 10. A serial clock signal A of the same frequency and synchronous with the serial data bits B is received on line 12. A serial word synchronizing signal C (further referred to as serial word sync) is received on line 14 synchronously with the first bit of each serial word received on line 10, thus indicating the length of the serial input words. Signals A, B and C are obtained from an outside source represented by blocks 175, 176 and 177 which source will be described later in more detail. In the preferred embodiment the length of each serial input word is selected 12 bits and two 12 bit serial input words are combined by the serial-to-parallel converter of FIG. 1 into one 24 bit parallel output word. However, as it will follow from further description, different respective lengths of the serial or parallel word may be also selected and one or more serial input words could be combined into a parallel output word of a desired length by the serial-to-parallel converter of the invention. Examples of timing diagrams of the respective signals A, B, C received on lines 12, 10 and 14 and of other related signals described below, are illustrated in FIG. 3.

Figure 1:
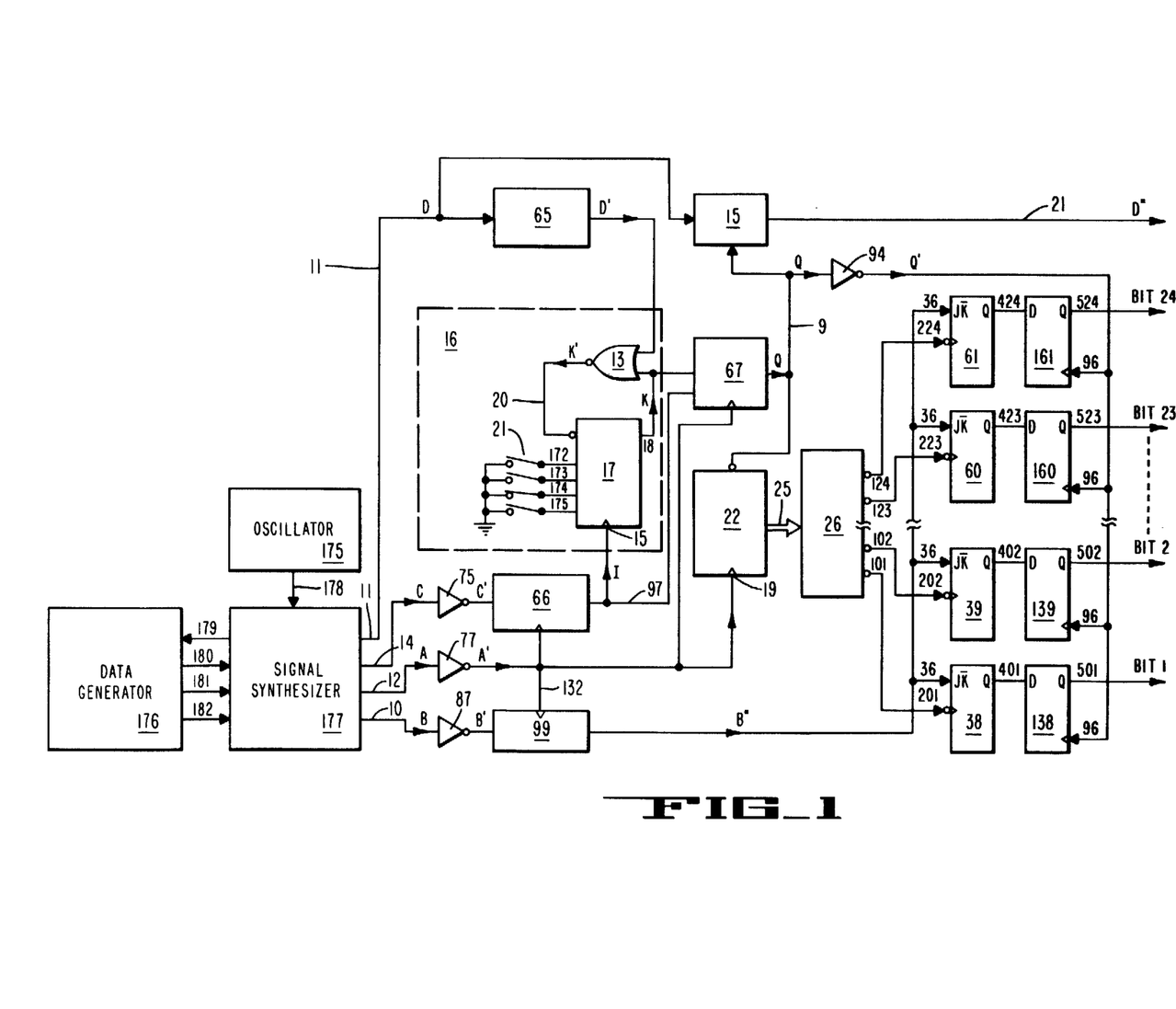
FIG. 1 is a simplified block diagram of a preferred embodiment of the invention.

With reference to FIG. 1, the serial sync C received on line 14 is applied via an inverter 75 and the inverted signal C' is fed via a pulse shaper and delay circuit 66 to a parallel clock signal generator circuit 16. In the preferred embodiment the circuit 16 comprises a frequency divider 17, gate 13 and a programmable word length selector, implemented by programmable switches 21. Circuit 16 produces an output pulse K at output 18 for every two serial sync pulses C received on line 14. Consequently, for every 24 serial clock pulses A, and thus, for every 24 serial data bits B received on line 10 an output pulse K at output 18 is provided. The output pulse K via gate 13 and line 20 resets divider 17. The output pulse K is further processed by a pulse shaping and delay circuit 67 to have a width corresponding to that of one serial clock cycle to assure proper circuit operation. The resulting reshaped pulse Q obtained on line 9 is utilized as a parallel clock signal, as it will follow from further disclosure.

The serial clock signal A received on line 12 is inverted by inverter 77 and the inverted signal A' is applied to a clock input 19 of a synchronous parallel bit counter 22 which counts 1 to 24 serial clock pulses and in response to each clock pulse it provides a distinct binary number on parallel lines 25. Counter 22 is reset by the previously mentioned parallel clock signal Q. It will be understood from the foregoing description that the respective elements 17, 22, 66 and 67 operate in synchronism with each other.

The count provided by counter 22 on parallel output lines 25 is applied to a decoder 26. In FIG. 1 the decoder 26 is shown as having 24 separate outputs designated 101 to 124 corresponding to the number of bits comprised in the parallel output word. The decoder 26 provides respective output pulses at its outputs 101 to 124 in a sequence corresponding to the sequential count obtained from counter 22 and in synchronism therewith. For example, in response to count "1" received from counter 22 the decoder 26 provides a pulse at its first output 101, at count "2" an output pulse at its second output 102 etc., up to the last count "24" when it provides an output pulse at its output 124. Thereafter, counter 22 is reset by the previously mentioned parallel clock pulse Q on line 9 and the above-described operation cycle is repeated.

Each separate output 101 to 124 of the decoder 26 is connected to a separate data input enable terminal 201 to 224 of a respective output storage means, implemented in the preferred embodiment by a first and second series of output latches 38 to 61 and 138 to 161, respectively. The serial input data B received on line 10 is inverted by inverter 87, further inverted by circuit 99 and delayed. The resulting serial data B" is applied simultaneously to the interconnected inputs 36 of the first series of output latches 38 to 61, coincidently with the respective output signals from decoder 26. Consequently, each serial data bit is sequentially clocked into one particular first output laatch 38 to 61 by a particular output pulse provided by decoder 26 in response to one particular count obtained from counter 22. Thus, a particular output latch is always enabled in response to a respective bit count and the sequential output latches store the serial data bits in the same order as they have been received on input line 10. For example, latch 38 receives and stores data bit 1, latch 39 data bit 2, etc., up to latch 61 which receives and stores data bit 24. The data respectively stored by the first output latches 38 to 61 is applied to the respective inputs 401 to 424 of second series of output latches 138 to 161. After all the 24 data bits are stored at the respective inputs of the second output latches 138 to 161, the data is subsequently transferred therefrom in form of a parallel output word as follows.

The previously described parallel clock pulse Q on line 9 is inverted by inverter 94 and the inverted pulse Q' is applied to interconnected data output enable terminals 96 of the respective second output latches 138 to 161. In response to receiving that signal Q', the respective 24 data bits stored in the second output latches 138 to 161 are clocked out simultaneously, thus forming a 24-bit parallel output word obtained at outputs 501 to 524.

In order to assure synchronous operation of the serial-to-parallel converter of the invention, in the preferred embodiment a synchronous control pulse D is received on line 11 from the previously mentioned outside source 175 to 177, as it will be described below in more detail. Control pulse D coincides with the first pulse of a selected number of serial word sync pulses C, for example of 2048 sync pulses. Control pulse D is applied to a pulse shaping circuit 65 to obtain a pulse width corresponding to that of one clock cycle. A resulting inverted control pulse D' from circuit 65 is applied via gate 13 and line 20 to reset the previously mentioned programmable frequency divider 17, thus initiating a new operation cycle to correct timing in case synchronization has been lost during the last 2048 sync pulses for any reason. In the preferred embodiment the control pulse D is delayed in a delay circuit 15 by approximately 24 serial clock cycles and thereafter it is transferred as pulse D" via line 21 in response to the parallel clock pulse on line 9, for use by a digital computer (not shown).

Figure 2D:
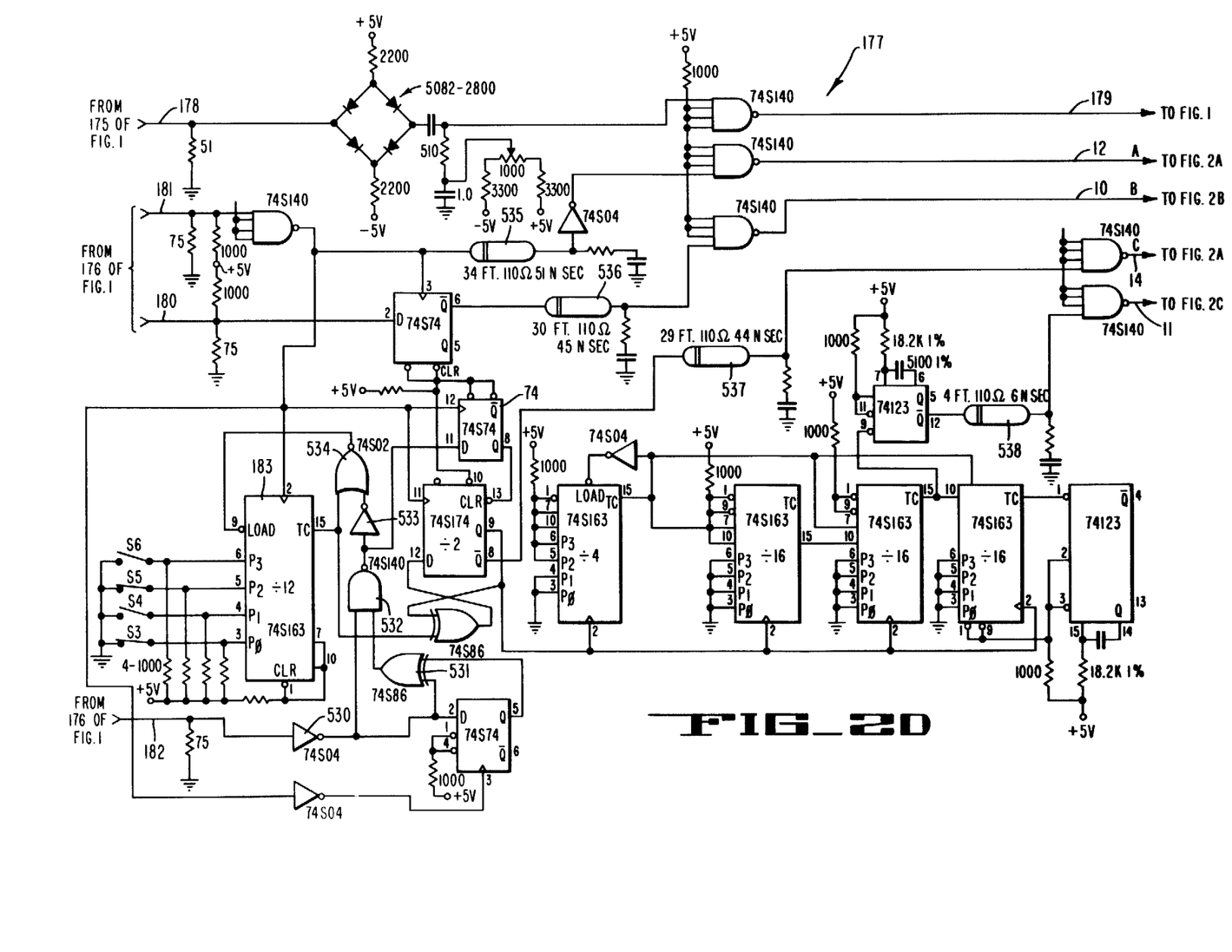
Figure 3:
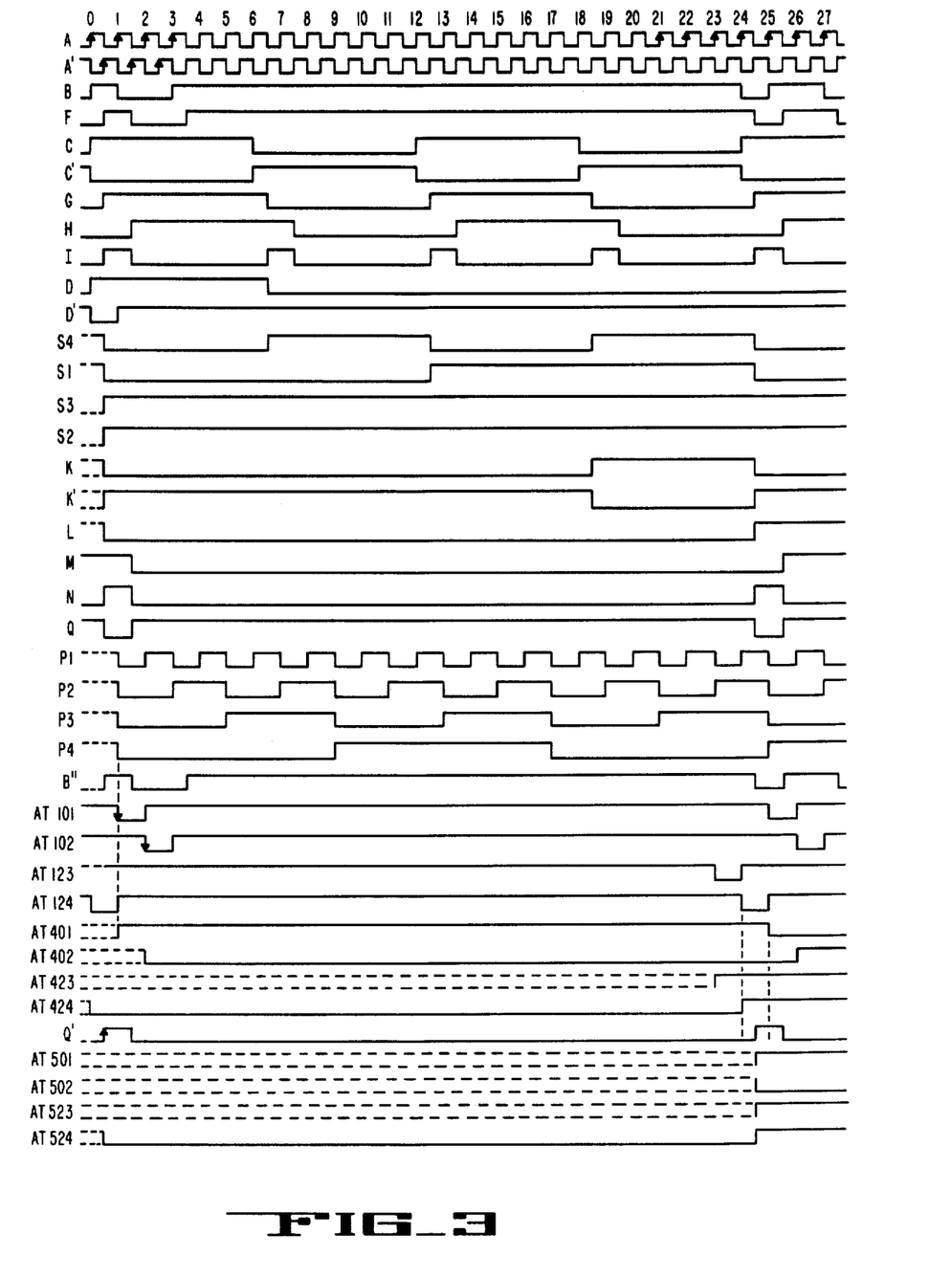
FIG. 3 is a timing diagram showing various signals illustrating operation of the preferred embodiment of the invention.

With reference to blocks 175, 176, and 177 shown in FIG. 1 they together represent a source for generating the above-mentioned respective synchronous signals A, B, C and D received on lines 12, 10, 14 and 11, and shown in FIG. 3. A sine wave oscillator 175 is utilized to generate a sine wave reference signal on line 178 whose frequency determines the frequency of the serial clock signal A, which in turn determines the rate of serial data B. In the preferred embodiment the oscillator 175 has a selectable frequency range from 400 KHz to 16 MHz, corresponding to the operation range of the serial-to-parallel converter of the preferred embodiment. In the preferred embodiment the sine wave oscillator 175 is implemented by Signal Generator, type 1702, manufactured by Systron Donner Co. The sine wave reference signal of a selected frequency from oscillator 175 is applied via line 178 to a signal synthesizer 177, a detailed diagram of which is shown in FIG. 2D as an example. The signal synthesizer 177 provides a digital clock signal of the same frequency as and synchronous with the analog signal on line 178 and applies that clock signal via line 179 to a random data generator 176, for example implemented by the Pseudorandom Data Generator, type MN-1, manufactured by Tautron Co. Data generator 176 in turn provides the following synchronous digital output signals: On line 180 generator 176 provides a sequence of random serial data bits, on line 181 a clock signal of the same frequency with the serial data bits and on line 182 it provides a synchronizing signal which in the preferred embodiment has a frequency of one pulse for every 32 serial data bits provided on line 180. The respective output signals on lines 180, 181, and 182 are received and processed by the signal synthesizer circuit 177 shown in a detailed schematic diagram of FIG. 2D, the description of which follows.

In FIG. 2D the synchronizing signal on line 182 is applied via suitable gates 530 to 534 to a presettable counter 183 which in the preferred embodiment is set to count to 12. However, counter 183 may be preset by switches S3 to S6 to provide various counts as shown, for example, in Table 1 below:

TABLE 1

| Divide by: | S6 | S5 | S4 | S3 |
|---|---|---|---|---|
| 2 | HI | HI | HI | HI |
| 4 | HI | HI | HI | LO |
| 6 | HI | HI | LO | HI |
| 8 | HI | HI | LO | LO |
| 10 | HI | LO | HI | HI |
| 12 | HI | LO | HI | LO |
| 14 | HI | LO | LO | HI |
| 16 | HI | LO | LO | LO |
| 32 | LO | LO | LO | LO |

It will become apparent that by selecting various division ratios from TAB. 1, it is possible to select a number of clock pulses corresponding to one output signal from counter 183 to determine the length of the serial input word. The signal synthesizer circuit 177 of FIG. 2D delays the respective signals received on lines 178, 180, 181 and 182 utilizing delay lines 535 to 538 and it reclocks the delayed signals to provide the above-described respective synchronized signals A, B, C and D as shown in FIGS. 1 and 3. The resulting signals obtained from the signal synthesizer 177 on lines 12, 10, 14 and 11 are aligned to coincide with the pulse representing bit 1 of the serial input word, as best shown in the timing diagram of FIG. 3. Delay lines 535 to 538 of FIG. 2D, and respective delay lines 175 of FIG. 2A and 88 of FIG. 2B, are made utilizing well known techniques, each as a pair of twisted insulated wires type KYNAR 30 AWG, and designated part number 1263197-XX, by Ampex Corporation.

A more detailed description of the preferred embodiment follows with reference to the schematic circuit diagram of FIGS. 2A to 2D, corresponding to the above-described block diagram of FIG. 1. To facilitate comparison, corresponding portions and elements in the above-indicated figures are designated by like reference numerals. For the purpose of complete disclosure, the integrated and other circuit components shown in FIGS. 2A to 2D are designated by respective part numbers commonly used by manufacturers.

Figure 2A:
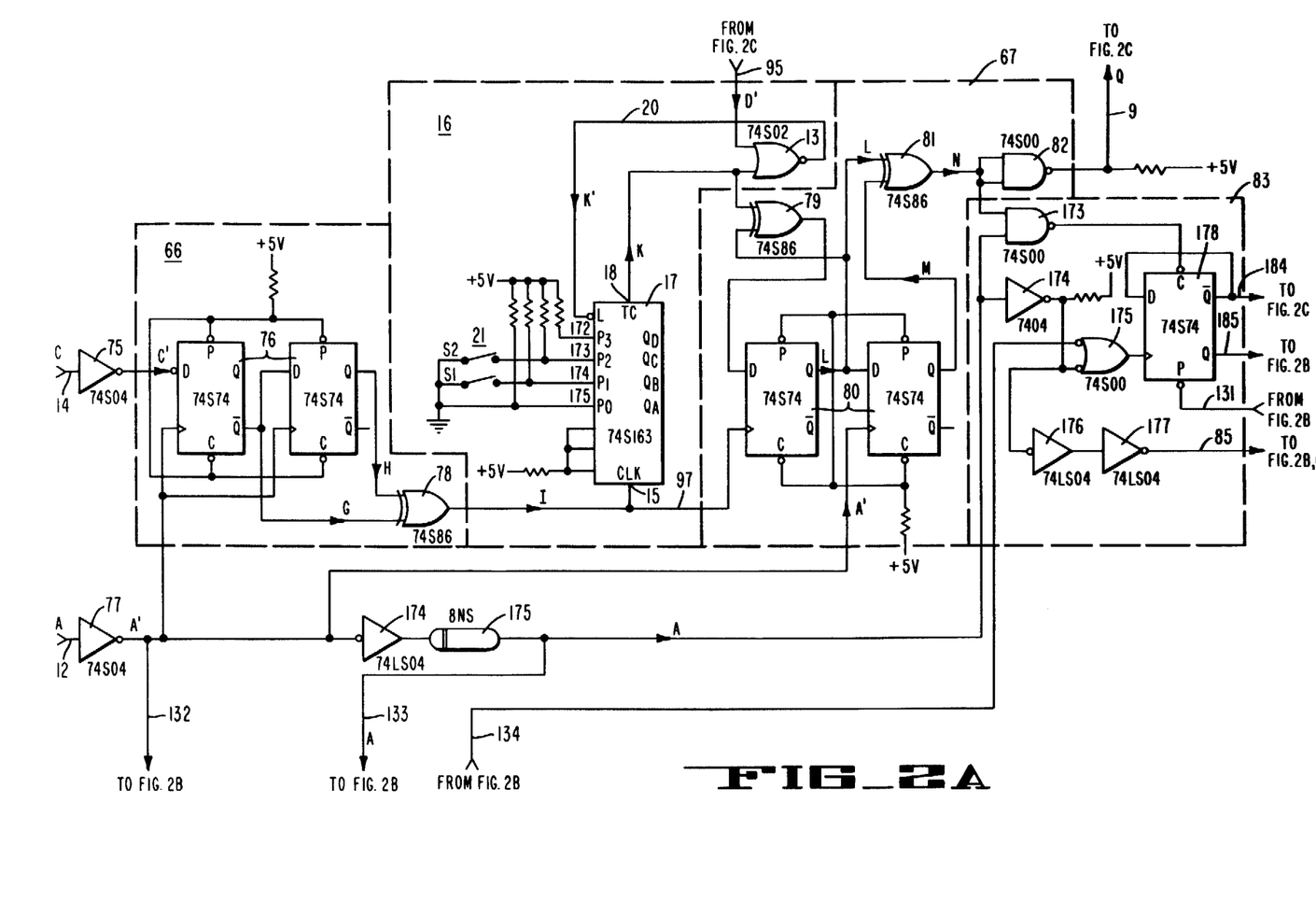
FIGS. 2A to 2D are respective portions of a detailed schematic circuit diagram of the preferred embodiment of the invention.
Figure 2B:
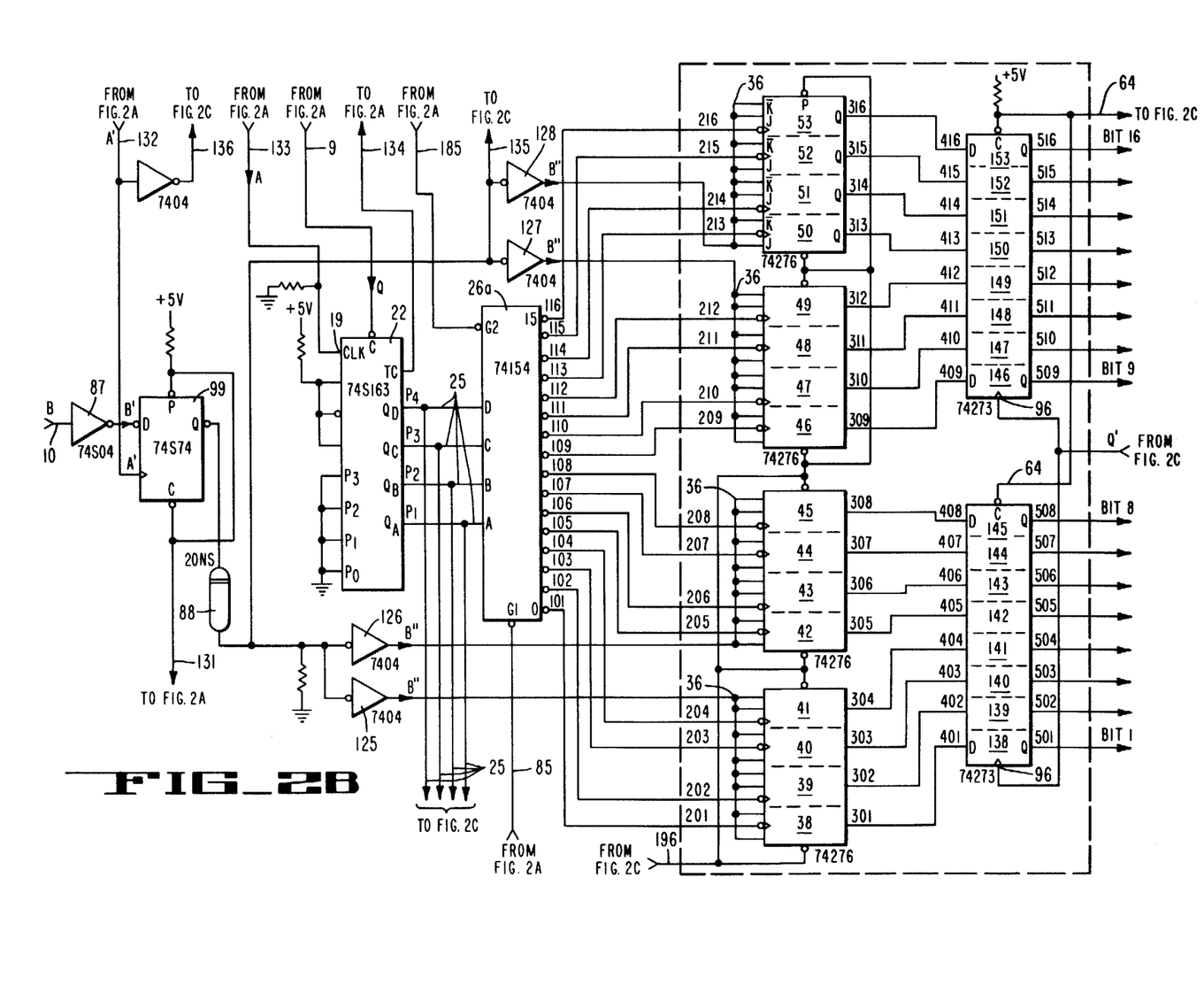

With reference to FIG. 2A and the timing diagram of FIG. 3, the serial word sync pulse C received on line 14 is applied via inverter 75 and the inverted pulse C' is applied to data input of a latch circuit 76. The serial clock signal A is received on line 12 and inverted by inverter 77. In the preferred embodiment the serial clock frequency is selected between 400 KHz and 16 MHz as previously mentioned. The inverted serial clock signal A' is applied to the respective clock inputs of the latch circuit 76 implemented by a pair of D flip-flops providing respectively delayed output signals G and H, both applied to exclusive OR-gate 78. The resulting output pulse I from gate 78 is delayed with respect to the input pulse C' by one half clock period and its width is set to correspond to one clock cycle. Signal I is applied to clock input 15 of programmable divider 17 of the parallel clock signal generator circuit 16. Thus, the frequency of signal I is twice that of signal C. The latch circuit 76 and gate 78 together serve as a pulse shaper and a frequency multiplier by two, and they correspond to circuit 66 of FIG. 1. The respective inputs 172 to 175 of the programmable divider 17 are preset by means of a programmable switch 21 to divider by 4. Since the frequency of clock signal I at the input 15 of divider 17 is twice the frequency of signal C, at output 18 of programmable divider 17 an output signal K is obtained whose frequency is divided by two with respect to signal C'. Different division ratios may be obtained from divider 17; for example, division by 1, 2, 3 and 4 may be obtained by setting the switches S1 and S2 as shown in TAB. 2 below:

TABLE 2

| Divide by: | S1 | S2 |
|---|---|---|
| 1 | HI | HI |
| 2 | LO | HI |
| 3 | HI | LO |
| 4 | LO | LO |

It will be understood that if it is desired to provide a still higher frequency ratio by divider 17, it may be done by utilizing additional switches (not shown) in the circuit 21, as it is known in the art. Programmable divider 17 is reset by signal K' via NOR-gate 13 and line 20. Besides, divider 17 may also be reset by the inverted control pulse D' from circuit 65 as it has been mentioned previously.

Output signal K from divider 17 is also applied via exclusive OR-gate 79 to latch 80, implemented by a pair of interconnected D flip-flops. Flip-flops 80 receive at respective clock inputs the previously described signals I and A', respectively. The output signals L, M from flip-flops 80 are both applied to exclusive OR-gate 81 and the output signal N therefrom is fed to NAND-gate 82. The output signal Q from NAND-gate 82 on line 9 represents the parallel clock signal described previously with reference to FIG. 1. Thus, the respective gates 79, 81, 82, and latch 80 together correspond to the previously described circuit 67 of FIG. 1 which serves to provide a parallel clock pulse Q having a width corresponding to that of the serial clock pulse, to obtain proper circuit operation.

It is seen from the foregoing description and from the timing diagram of FIG. 3, that by the circuit of the preferred embodiment one parallel clock pulse Q is generated synchronously for each sequence of 24 serial clock pulses A. However, if it is desired to change the number of serial clock pulses corresponding to one parallel clock cycle, it may be readily provided by presetting divider 17 by means of switches 21 to have a different division ratio corresponding to a desired integer number of word sync pulses.

A control circuit 83 shown in FIG. 2A is employed to provide various control signals necessary for the operation of the serial-to-parallel converter of FIGS. 2A to 2D. A NAND gate 173 of control circuit 83 receives at one input the previously described signal N from the exclusive OR-gate 81 of FIG. 2A and the delayed serial clock A at its other input. A D flip-flop 178 is utilized to provide respective complementary output pulses on lines 184, 185 which pulses provide necessary switching between respective decoders 26a and 26b to provide continuous operation, as it will become apparent from further description. The inverted serial clock signal A' from the inverter 77 shown in FIG. 2A is further passed via inverter 174 and delayed by delay line 175 and thereafter applied via line 133 to clock input 19 of the parallel bit counter 22 shown in FIG. 2B. Counter 22 of FIG. 2B counts from 1 to 16 serial clock pulses. Each respective count from counter 22 obtained on parallel output lines 25 is represented as a distinct four bit binary number P1; P2; P3; P4. The respective counts 1 to 16 from counter 22 are applied via lines 25 to respective inputs connected in parallel of two interconnected 4 to 16 line decoders 26a, 26b, together corresponding to decoder 26 of FIG. 1. Decoder 26a is shown in FIG. 2B and decoder 26b in FIG. 2C. The decoders 26a, 26b receive from control circuit 83 the previously mentioned respective control signals on lines 185, 184, providing the necessary switching between them. For each received count one of the decoders 26a, 26b provides an output pulse at one respective output 101 to 124. It will be understood that the interconnected decoders 26a, 26b have a number of separate outputs corresponding to the selected number of bits in the parallel output word and that they provide the respective output signals in a known predetermined sequence. It is seen from FIGS. 2B and 2C that after respective output signals have been provided at all 16 outputs of decoder 26a, in response to counts 1 to 16 from counter 22 the decoder 26b is switched on. Thereafter counter 22 counts again from 1 to 8 and in response to the latter counts respective output pulses from outputs 117 to 124 of decoder 26b are provided. Only eight outputs of decoder 26b are utilized in addition to the 16 outputs of decoder 26a to obtain the total of 24 outputs. Thus, the remaining eight unused ouputs of decoder 26b may be utilized for applications having a parallel word length up to 32 bits. In the preferred embodiment the counter 22 is reset by the above-described parallel clock signal Q obtained on line 9 FIG. 2A after 24 output pulses have been provided sequentially by decoders 26a, 26b. If it is desired to provide a parallel output word having a greater length than 32 bits, additional decoders may be interconnected and utilized in a similar manner, as shown by 26a, 26b in the preferred embodiment.

Figure 2C:
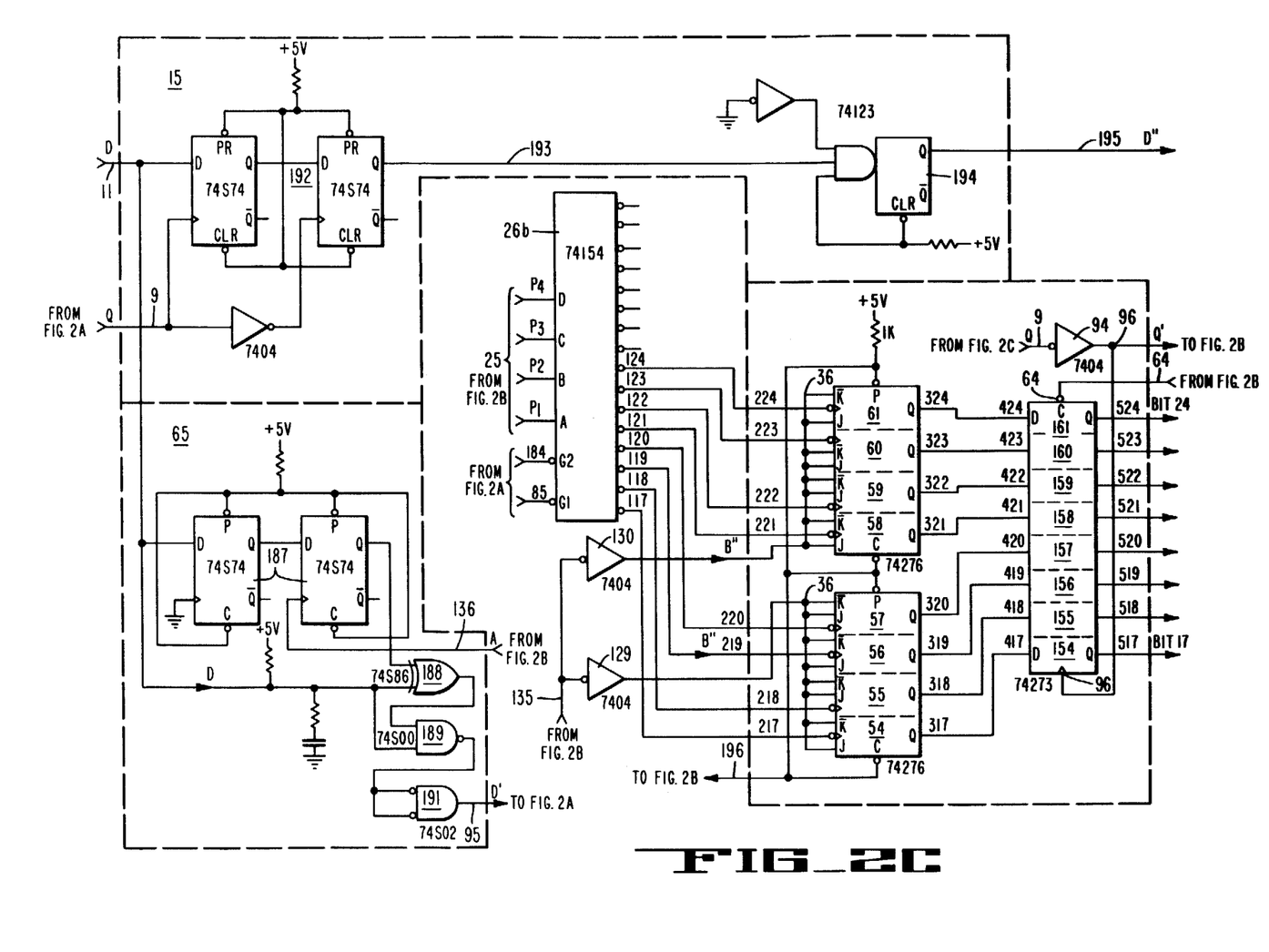

As it is seen from FIGS. 2B and 2C, each respective output 101 to 124 of decoders 26a, 26b is connected to a separate data input enable terminal 201 to 224, represented by respective clock inputs of respective J-K flips-flops 38 to 61. The latter flip-flops implement the first series of output latches described above with reference to FIG. 1. Each J-K flip-flop has a respective separate data output terminal 301 to 324.

The serial data B received on line 10 in FIG. 2B is inverted by inverter 87. The inverted data is reclocked by flip-flop 99 utilizing serial clock signal A' applied on line 132 from inverter 77 of FIG. 2A. The reclocked signal is delayed by delay line 88. The delayed inverted data is once more inverted by one of the parallel inverters 125 to 130, respectively, and applied as data B" simultaneously to interconnected J-K inputs 36 of first flip-flops 38 to 61. It is seen from the timing diagram of FIG. 3 in connection with the circuit diagram of FIGS. 2A to 2C that the data B" has been delayed by a time necessary for the leading edges of clock pulses A to fall approximately in the middle of data bits B". The latter provision assures that the edges of respective output pulses P1 to P4 on lines 25 from counter 22 indicating bit counts also coincide with the middle of data pulses B". As a result, the first output pulse at output 101 from the decoder 26a has its leading edge coinciding with the middle of the serial data pulse B", corresponding to the first bit of the serial input word, thus allowing clocking in the middle of the data cell. Similarly, the second output pulse at 102 from the decoder 26a has its leading edge coinciding with the middle of the second data pulse of the serial input word. The latter sequence is repeated for the remaining serial input bits up to bit 24 of the input word, the middle of which input pulse coincides with the leading edge of output pulse obtained at output 124 from decoder 26b shown in FIG. 2C. The respective output pulses at outputs 101 to 124 of decoders 26a, 26b appear at the previously mentioned respective separate data input enable terminals 201 to 224 of the first series of output latches, implemented by the respective clock inputs of J-K flip-flops 38 to 61. Thus when the consecutive data bits B" appear at the interconnected data inputs 36 of the latter flip-flops, one particular serial data bit is clocked into each flip-flop 38 to 61 sequentially. The thusly clocked-in data appears sequentially at the respective outputs 301 to 324 of flip-flops 38 to 61 and simultaneously at the respective inputs 401 to 424 of the second series of output latches, implemented by D flip-flops 138 to 161, which inputs are connected with the outputs 301 to 324, respectively. After all the data bits 1 to 24 have been stored and appear at inputs 401 to 424 of the second series of flip-flops 138 to 161, the previously described parallel clock pulse Q on line 9 of FIG. 2A is applied as pulse Q' via inverter 94 of FIG. 2C to the respective interconnected data output enable terminals 96 of the respective second series of flip-flops 138 to 161. Consequently, all the stored data bits 1 to 24 appear simultaneously at the respective outputs 501 to 524 of the second series of flip-flops as it is also shown in the timing diagram of FIG. 3, thus providing the parallel output word.

It is seen from the foregoing description that in the serial-to-parallel converter of FIGS. 2A to 2D the serial input data B" is fed to the output latches via a direct data path, while each input data bit is sequentially clocked into a designated output latch 38 to 61 in response to a designated output pulse on line 101 to 124, respectively, from the decoder 26a, 26b. Thus, the respective locations of input data bits are known at any time during operation and a particular data bit may be easily traced and recovered, for example, for trouble shooting purposes.

In FIG. 2C the pulse shaper circuit 65 is shown as being implemented by a pair of D flip-flops 187 and gates 188 to 191 respectively. Circuit 65 receives the control pulse D on line 11 provided by the signal synthesizer 177 as it has been previously described with reference to FIG. 1. Circuit 65 sets the width of the latter pulse to correspond to one serial clock cycle. The resulting pulse D' from gate 191 at the output 95 of circuit 65 in FIG. 2C is applied to gate 13 of FIG. 2A. Thus, as described earlier with respect to FIG. 1, at every 2048 word synchronizing pulse the frequency divider 17 is reset via gate 13 by pulse D'. Pulse D received on line 11 is also applied to delay circuit 15 shown in FIG. 2C as comprising a pair of D flip-flops 192 followed by a monostable multivibrator 194. Pulse D is delayed by 24 serial clock cycles in D flip-flops 192 and released therefrom in response to the previously described parallel clock pulse Q applied via line 9 to clock input of flip-flops 192. The monostable multivibrator 194 shapes the delayed pulse to obtain a desired pulse width. In the preferred embodiment the resulting control pulse D" from multivibrator 194 is applied via line 195 to a computer (not shown) synchronously with the previously described parallel output word from outputs 501 to 524 of the second series of output latches 138 to 161 for further use.

It is seen from the foregoing disclosure that in the serial-to-parallel converter of the invention a particular output latch is assigned to every bit of the parallel output word and subsequent data bits are stored sequentially in the output latches. The length of the serial input word or parallel output word can be changed in a relatively simple manner, respectively, while the data paths of the first and subsequent bits of the parallel output word through the device remain unchanged. When operation is interrupted the respective bit positions and data paths remain undisturbed within the device of the invention.

While preferred embodiments of the invention have been described above and illustrated in the drawings, it will be appreciated that a number of alternatives and modifications may be made which will fall within the scope of the appended claims.

What is claimed:

1. A serial-to-parallel converter receiving respectively serial clock pulses, serial data bits synchronous with the serial clock pulses, a selected number of consecutive serial data bits forming a serial input word, said converter further receiving serial word synchronizing pulses synchronous with said serial input words, said converter comprising in combination:
   (a) a means for receiving said serial word synchronizing pulses and generating a parallel clock pulse in response to an integer number of serial word synchronizing pulses and synchronously therewith;
   (b) a counter means having an input for receiving said serial clock pulses and an output for synchronously providing a respective count in response to each received serial clock pulse, said counter means coupled to be reset by said parallel clock pulse;
   (c) a decoder means having an input for receiving said count provided by said counter means and having a plurality of separate outputs each coupled to provide a separate output signal in response to each count and synchronously therewith;
   (d) a plurality of output storage means each having a separate data input enable terminal coupled to one separate output of said decoder means and each having a separate data output terminal, said plurality of output storage means having interconnected data input terminals for receiving simultaneously said serial data bits and having interconnected data output enable terminals for receiving simultaneously said parallel clock pulse, respectively, each said output storage means being coupled to store one particular serial data bit received thereby coincidently with a particular separate output signal from said decoder means and said plurality of output storage means being coupled to apply simultaneously said stored data bits to said separate outputs in form of a parallel output word in response to and synchronously with receiving said parallel clock pulse.

2. The serial-to-parallel converter of claim 1, wherein said means for receiving said serial word synchronizing pulse and generating a parallel clock pulse comprises a synchronous frequency divider means.

3. The serial-to-parallel converter of claim 2, wherein said means for generating a parallel clock pulse further comprises a parallel word length selector means coupled to said synchronous frequency divider means for presetting its division ratio to correspond to said integer number of serial word synchronizing pulses.

4. The serial-to-parallel converter of claim 3, wherein said parallel word length selector means is an adjustable switch.

5. The serial-to-parallel converter of claim 1, wherein said plurality of output storage means comprises a plurality of first and second output latches respectively, each said first output latch having a clock input terminal coupled to one said separate output of said decoder means, a data output terminal coupled to a data input terminal of one said second output latch, respectively, said first output latches having their respective data input terminals interconnected, each said second latch having a separate data output terminal and having interconnected clock input terminals for receiving simultaneously said parallel clock pulse.

6. The serial-to-parallel converter of claim 5, wherein the number of said first and second output latches respectively matches the number of said stored data bits forming said parallel output word.

7. The serial-to-parallel converter of claim 6, wherein said first output latches comprise J-K type flip-flops and said second output latches comprise D type flip-flops, respectively.

8. A serial-to-parallel converter receiving respectively serial clock pulses, serial data bits synchronous with the serial clock pulses, a selected number of consecutive serial data bits forming a serial input word, said converter further receiving serial word synchronizing pulses synchronous with said serial input words, said converter comprising in combination:
   (a) a synchronous frequency divider means coupled to receive said serial word synchronizing pulses and to provide a parallel clock pulse synchronously with an integer number of said serial word synchronizing pulses;
   (b) a binary counter means coupled to receive said serial clock pulses and to provide a count synchronously therewith, said counter means having a reset terminal coupled to receive said parallel clock pulse;
   (c) a decoder means having an input coupled to receive said count and having a number of separate outputs each coupled to provide a separate output signal in response to each count;
   (d) a number of first and second output latches, respectively said first output latches each having a separate data input enable terminal coupled to one separate output of said decoder means, a separate data output terminal, and interconnected data input terminals coupled to receive simultaneously said serial data bits, said second output latches each having a separate data input terminal coupled to the data output terminal of one said first output latch, a separate data output terminal and interconnected data output enable terminals coupled to receive simultaneously said parallel clock pulse, respectively, each said first output latch being coupled to store one particular serial data bit received simultaneously with one said separate output signal from said decoder means, and each said second output latch being coupled to apply one said stored data bit to its data output terminal in response to receiving said parallel clock pulse.

9. The serial-to-parallel converter of claim 8 wherein said first output latches comprise J-K type flip-flops and said second output latches comprise D type flip-flops.

10. The serial-to-parallel converter of claim 8 further comprising a means for presetting the division ratio of said synchronous frequency divider means to match said integer number of said serial word synchronizing pulses.

11. The serial-to-parallel converter of claim 10 wherein said means for adjusting said ratio are adjustable switches.

* * * * *